US006297172B1

(12) United States Patent
Kashiwagi

(10) Patent No.: US 6,297,172 B1
(45) Date of Patent: Oct. 2, 2001

(54) METHOD OF FORMING OXIDE FILM

(75) Inventor: Akihide Kashiwagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/588,238

(22) Filed: Jun. 6, 2000

(30) Foreign Application Priority Data

Jun. 7, 1999 (JP) .............................. P11-159591

(51) Int. Cl.$^7$ ................................. H01L 21/02
(52) U.S. Cl. ........................................ 438/773; 438/787
(58) Field of Search ........................ 438/773, 787, 438/770, 769, 694, 735, 738; 257/183, 77, 616

(56) References Cited

U.S. PATENT DOCUMENTS

| | | | |
|---|---|---|---|
| 5,155,336 | * 10/1992 | Gronet et al. | 219/411 |
| 5,414,244 | * 5/1995 | Imahashi | 219/497 |
| 5,672,539 | * 9/1997 | Tahkur et al. | 437/70 |
| 6,037,273 | * 3/2000 | Gronet et al. | 438/773 |
| 6,064,081 | * 5/2000 | Robinson et al. | 257/183 |
| 6,133,150 | * 10/2000 | Nakajima et al. | 438/694 |
| 6,159,866 | * 12/2000 | Gronet et al. | 438/770 |

* cited by examiner

Primary Examiner—Michael Lebentritt
(74) Attorney, Agent, or Firm—Ronald P. Kananen; Rader, Fishman & Grauer

(57) ABSTRACT

A method of forming an oxide film comprising the steps of; (A) generating a water vapor atmosphere in a process chamber in a state where partitioning means is closed, and transferring a substrate into a substrate transfer portion, (B) opening the partitioning means after the transfer of the substrate into the substrate transfer portion is completed, and transferring the substrate into the process chamber having the water vapor atmosphere, (C) thermally oxidizing a semiconductor layer on the surface of the substrate in the process chamber having the water vapor atmosphere, to form an oxide film having a predetermined thickness on the surface of the semiconductor layer, and (D) changing the atmosphere in the process chamber into an inert gas atmosphere, then transferring the substrate out of the process chamber, closing the partitioning means and transferring the substrate out of the substrate transfer portion.

7 Claims, 9 Drawing Sheets

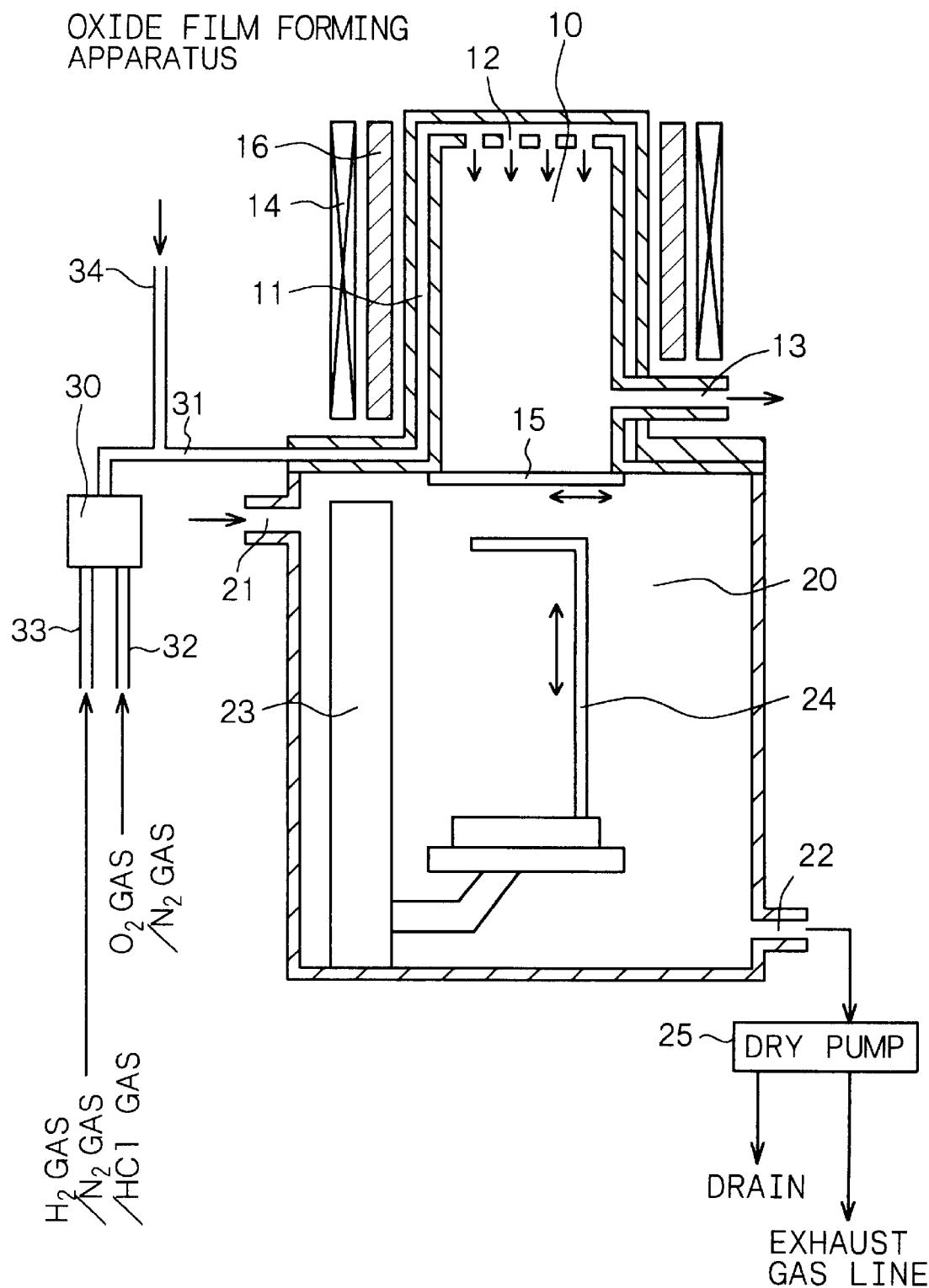

[STEP-110] TRANSFER OF SEMICONDUCTOR SUBSTRATES INTO SUBSTRATE TRANSFER PORTION

[STEP-120] OPENING OF SHUTTER 15

[STEP-120] CONTINUED

[STEP-130]

[STEP-140]

DECREASING TEMPERATURE IN PROCESS CHAMBER

[STEP-140] CONTINUED

TRANSFER OF SILICON SEMICONDUCTOR SUBSTRATES OUT OF PROCESS CHAMBER

METHOD OF FORMING OXIDE FILM

BACKGROUND OF THE INVENTION AND RELATED ART STATEMENT

The present invention relates to a method of forming an oxide film on a semiconductor layer on a surface of a substrate in the production of a semiconductor device.

For example, in producing a MOS type silicon semiconductor device on the basis of a silicon semiconductor substrate, it is required to form a gate oxide film composed of a silicon oxide film ($SiO_2$ film) on a surface of the silicon semiconductor substrate. In the production of a thin film transistor (TFT), it is also required to form a gate oxide film composed of a silicon oxide film ($SiO_2$ film) on a surface of a silicon layer formed on an insulating substrate. It is no exaggeration to say that the reliability of semiconductor devices depends upon these silicon oxide films. The silicon oxide films are therefore constantly required to have high dielectric breakdown durability and long-term reliability. In a MOS type silicon semiconductor device, a silicon oxide film is used for forming a device-isolating film and an insulating interlayer in addition to the gate oxide film.

The method of forming the above silicon oxide films includes a thermal oxidation method, a vapor phase growth method and a sputtering method. For forming silicon oxide films having a very small thickness of several nanometers to ten and several nanometers for use as a gate oxide film, a thermal oxidation method is used in view of excellent interface characteristics and easiness in controlling a film thickness.

As a thermal oxidation method, there has been hitherto used a method in which high-purity water vapor is introduced into a process chamber made of a quartz furnace core tube heated with a cylindrical resistance heater to thermally oxidize a surface of a silicon semiconductor substrate (to be referred to as "wet oxidation method" hereinafter). The wet oxidation method is said to be feasible for forming an oxide film having excellent electric reliability over an oxide film formed by an oxidation method using a high-purity dry oxygen gas (to be referred to as "dry oxidation method" hereinafter). In the wet oxidation method, generally, a hydrogen gas is mixed with an oxygen gas at a high temperature and water vapor generated by the combustion of the hydrogen gas is used. Such a wet oxidation method is called a hydrogen combustion oxidation method or a pyrogenic oxidation method. An oxide film formed by the wet oxidation method will be sometimes called a wet oxide film, and an oxide film formed by the dry oxidation method will be sometimes called a dry oxide film.

The above process chamber with a resistance heater includes a horizontal type process chamber which is a horizontally maintained process chamber made of a quartz furnace core tube and a vertical type process chamber which is a vertically maintained process chamber made of a quartz furnace core tube. Meanwhile, a natural oxide film is formed due to inclusion (inflow) of atmosphere during the transfer of a silicon semiconductor substrate into a process chamber, and the influence of the natural oxide film is no longer negligible with a decrease in the thickness of an oxide film. The natural oxide film contains impurities from atmosphere and dry oxide film component. When the amount ratio of the natural oxide film contained in the oxide film increases with a decrease in the oxide film, the oxide film formed by the wet oxidation method deteriorates in electric characteristics. Therefore, the vertical type process chamber constitutes the main stream at present, since it makes it easy to prevent the inclusion (inflow) of atmosphere.

If a silicon semiconductor substrate is transferred into the process chamber in a state where the inner atmosphere in the process chamber is an inert gas atmosphere or a vacuum atmosphere, the formation of a natural oxide film can be suppressed. Since, however, the natural oxide film works as a protective oxide film on one hand, it may cause a decrease in the electric characteristics and reliability of a semiconductor device if the formation of the natural oxide film is simply suppressed.

When a MOS type silicon semiconductor device is produced on the basis of a silicon semiconductor substrate, generally, the silicon semiconductor substrate is subjected to RCA cleaning before an oxide film is formed. That is, the surface of the silicon semiconductor substrate is cleaned with an $NH_4OH/H_2O_2$ aqueous solution and further cleaned with an $HCl/H_2O_2$ aqueous solution to remove fine particles and metal impurities from its surface. When the RCA cleaning is carried out, the surface of the silicon semiconductor substrate reacts with the cleaning solutions, to form a silicon oxide film having a thickness of approximately 0.5 nm to 1 nm. The thus-formed silicon oxide film has a non-uniform thickness and has a residual cleaning solution content. The silicon semiconductor substrate is therefore immersed in a hydrofluoric acid aqueous solution to remove the above silicon oxide film, and further, a chemical component is removed with pure water. As a result, the silicon semiconductor substrate eventually has a surface most of which is terminated with hydrogen and a very small part of which is terminated with fluorine. In the present specification, obtaining a silicon semiconductor substrate surface most of which is terminated with hydrogen and a very small part of which is terminated with fluorine by the above step will be described as exposing a surface of a silicon semiconductor substrate. Then, an oxide film is formed on the surface of the above silicon semiconductor substrate.

Meanwhile, when a silicon semiconductor substrate is exposed to a high-temperature inert gas or vacuum atmosphere, the silicon semiconductor substrate is caused to have a roughened surface due to the elimination of silicon atoms and fluorine atoms from the silicon semiconductor substrate and a nitriding reaction in the silicon semiconductor substrate, so that the oxide film is poor in an electric insulation property and reliability. Nevertheless, the natural oxide film works to prevent the above surface roughening. For reducing the natural oxide film, therefore, it is required to attain the prevention of roughening of an interface between the oxide film and the silicon semiconductor substrate at the same time.

As a method for overcoming the above problem, for example, there can be a method in which a silicon semiconductor substrate is transferred into the process chamber with flowing oxygen gas at a very small rate. This method will be explained with reference to FIG. 10 showing a schematic cross-sectional view of an oxide film forming apparatus having a conventional vertical type process chamber (oxidation furnace).

Silicon semiconductor substrates on each of which a silicon oxide film is to be formed are transferred onto a quartz boat 24 disposed in a substrate transfer portion 20 through a door (not shown). In this occasion, a shutter 15 is closed, and a process chamber 10 is maintained to internally have a nitrogen gas atmosphere (temperature: 700° C.) containing 0.1% by volume of oxygen gas.

In this state, an inert gas (for example, nitrogen gas) is introduced into the substrate transfer portion 20 at a flow rate of 300 SLM from a gas inlet port 21 and discharged out of a gas outlet port 22, whereby the atmosphere in the substrate transfer portion 20 can be changed into an inert gas atmosphere. And, an oxygen concentration meter (not shown) is used to measure a concentration of residual oxygen gas in the substrate transfer port 20. When the oxygen gas concentration is found to be 100 ppm or less, the shutter 15 is opened, and the quartz boat 24 is moved upward with an elevator mechanism 23 to transfer the silicon semiconductor substrates into the process chamber 10.

After the silicon semiconductor substrates are transferred into the process chamber 10 in the above manner, oxygen gas and hydrogen gas are introduced into a combustion chamber 30 through pipings 32 and 33 and mixed in the combustion chamber 30 to combust the hydrogen gas for generating water vapor. The water vapor is introduced into the process chamber 10 through a piping 31, a gas line 11 and a gas inlet port 12. Then, thermal oxidation is initiated as described above. In this case, the formation of a natural oxide film caused by including atmosphere (inflow of atmosphere) can be prevented, and further, the above protective oxide film is formed on the surface of the silicon semiconductor substrate by a very small amount of oxygen gas, so that the surface roughening of the silicon semiconductor substrate can be prevented.

As other means, after the silicon semiconductor substrates are transferred into the process chamber maintained at a temperature of as low as 300° C., a thin silicon oxide film is formed on the surface of the silicon semiconductor substrate by a dry oxygen gas, then, and the atmosphere in the process chamber is changed to an argon atmosphere, followed by temperature-increase up to 900° C. Then, thermal oxidation is carried out. In this case, it is said that the oxide film formed at a low temperature works as a protective oxide film, so that the surface roughening of the silicon semiconductor substrate can be prevented (see, for example, Proceeding of No. 25 Ultra-Clean Technology Workshop, pages 3 and 4, sponsored by USC Semiconductor Substrate Technology Researchers Meeting).

However, the above method uses, as a protective oxide film, a dry oxide film formed by oxygen gas, which means that a dry oxide film having a certain thickness is formed prior to the formation of a wet oxide film at a high temperature. When the above method is applied, for example, to the process of forming a gate oxide film, the amount ratio of the dry oxide film component increases with a decrease in the thickness of the gate oxide film, and as a result, excellent properties of the wet oxide film decreases.

OBJECT AND SUMMARY OF THE INVENTION

It is therefore an object of the present invention to provide a method of forming an oxide film, which method enables the formation of a so-called wet oxide film as a protective oxide film for preventing the surface roughening of a semiconductor layer.

According to the present invention, the above object of the present invention is achieved by a method of forming an oxide film by means of an oxide film forming apparatus having;

(a) a substrate transfer portion,
(b) a process chamber which communicates with the substrate transfer portion and is for thermally oxidizing a semiconductor layer on a surface of a substrate in a water vapor atmosphere, to form an oxide film, and
(c) openable and closable partitioning means provided between the substrate transfer portion and the process chamber, the method comprising the steps of;

(A) generating a water vapor atmosphere in the process chamber in a state where the partitioning means is closed, and transferring the substrate into the substrate transfer portion,
(B) opening the partitioning means after the transfer of the substrate into the substrate transfer portion is completed, and transferring the substrate into the process chamber having the water vapor atmosphere,
(C) thermally oxidizing the semiconductor layer on the surface of the substrate in the process chamber having the water vapor atmosphere, to form an oxide film having a predetermined thickness on the surface of the semiconductor layer, and
(D) changing the atmosphere in the process chamber into an inert gas atmosphere, then transferring the substrate out of the process chamber, closing the partitioning means and transferring the substrate out of the substrate transfer portion.

In the method of forming an oxide film, provided by the present invention, the oxidation film forming apparatus may be a vertical type oxide film forming apparatus in which the process chamber made, for example, of a quartz furnace core tube is vertically arranged or a horizontal type oxide film forming apparatus in which the process chamber is horizontally arranged. When the vertical type oxide film forming apparatus is used, generally, the formation of the oxide film is carried out with regard to a plurality of the substrates, and so-called batch processing is carried out. When the horizontal type oxide film forming apparatus is used, generally, the formation of the oxide film is carried out with regard to one substrate, and so-called single wafer processing is carried out.

In the method of forming an oxide film, provided by the present invention, an oxide film can be formed on the surface of the semiconductor layer during the transfer of the substrate into the process chamber in the step (B) although it depends upon the structure of the oxide film forming apparatus and the atmosphere in the process chamber during the transfer of the substrate. The thus-formed oxide film works as a protective oxide film.

In the steps (A), (B) and (C), the water vapor atmosphere in the process chamber is preferably a water vapor atmosphere diluted with an inert gas or a water vapor atmosphere diluted with an inert gas and an oxygen gas although it depends upon a structure of the oxide film forming apparatus. The atmosphere in the process chamber will be referred to as "process-chamber atmosphere". In the steps (A) and (B), the lower limit of the temperature of the process-chamber atmosphere can be any temperature so long as no condensation into water takes place. For example, the lower limit is 200° C., preferably 300° C. The upper limit of the temperature of the process-chamber atmosphere is preferably determined to a temperature at which thermal shock causes no defect in the semiconductor layer when the substrate is transferred into the process chamber, for example, between 700° C. and 800° C.

In the method of forming an oxide film, provided by the present invention, preferably, the substrate transfer portion in the step (B) is maintained in a state where water vapor which has flowed into the substrate transfer portion from the process chamber during the transfer of the substrate into the process chamber is not condensed into water in the substrate transfer portion. More specifically, for generating a state where the water vapor which has flowed into the substrate transfer portion from the process chamber is not condensed into water in the substrate transfer portion, preferably, an inert gas is introduced into the substrate transfer portion such that the partial pressure of the water vapor in the substrate transfer portion is lower than the saturation water vapor pressure of water at a temperature of the atmosphere in the substrate transfer portion, or the atmosphere in the substrate transfer portion is adjusted to a temperature at which the partial pressure of the water vapor in the substrate transfer portion is lower than the saturation water vapor pressure of water at a temperature of the atmosphere in the substrate transfer portion. The atmosphere in the substrate transfer portion will be referred to as "substrate-transfer-portion atmosphere".

Otherwise, in the method of forming an oxide film, provided by the present invention for attaining a state where water vapor which has flowed into the substrate transfer portion from the process chamber during the transfer of the substrate into the process chamber is not condensed into water in the substrate transfer portion, preferably, an inert gas is introduced into the process chamber in the step (B) such that the partial pressure of the water vapor in the substrate transfer portion is lower than the saturation water vapor pressure of water at a temperature of the substrate-transfer-portion atmosphere. From the viewpoint of process simplification, preferably, an inert gas is introduced into the process chamber in the step (A).

In the method of forming an oxide film, provided by the present invention, the method of generating water vapor to be introduced into the process chamber is preferably at least one method selected from;

(1) a method in which a hydrogen gas and an oxygen gas are reacted at a high temperature (a so-called pyrogenic method), (2) a method in which pure water is heated, (3) a method in which heated pure water is bubbled with an oxygen gas or an inert gas, (4) a method in which a hydrogen gas and an oxygen gas are reacted in the presence of a catalyst (examples of which include Ni-containing catalysts such as NiO, Pt-containing catalysts such as Pt and $PtO_2$, Pd-containing catalysts such as Pd and PdO, Ir-containing catalysts, Ru-containing catalysts such as Ru and $RuO_2$, Ag-containing catalysts such as Ag or $Ag_2O$, Au-containing catalysts, Cu-containing catalysts such as CuO, Mn-containing catalysts such as $MnO_2$ and Co-containing catalysts such as $CO_3O_4$), and (5) a method in which oxygen plasma and hydrogen plasma are reacted.

That is, water vapor to be introduced into the process chamber may be generated by any one of the above methods (1) to (5) or may be generated by two or more methods of them. Further, the water vapor being generated may be diluted with an inert gas or an oxygen gas.

When a hydrogen gas and an oxygen gas are reacted in the presence of a catalyst to generate water vapor, the catalyst is packed in a water vapor generating unit, and for example, it is heated to a predetermined temperature with a heater disposed in the water vapor generating unit. And, a hydrogen gas and an oxygen gas are fed to the water vapor generating unit, whereby the hydrogen gas and the oxygen gas are reacted to generate water vapor.

When oxygen plasma and hydrogen plasma are reacted to generate water vapor, a hydrogen gas and an oxygen gas are irradiated with a 1 GHz to 100 GHz electromagnetic wave (for example, microwave having a frequency of 2.45 GHz). In oxygen plasma generated by microwave discharging, a ground state $O_2(X^3\Sigma g^-)$ is excited to an excited state $O_2(A^3\Sigma u^+)$ or $O_2(B^3\Sigma u^-)$ due to collision of electrons, and these are dissociated into oxygen atoms as shown by the following expressions.

$$O_2(X^3\Sigma g^-)+e\rightarrow O_2(A^3\Sigma u^+)+e \quad (1\text{-}1)$$

$$O_2(A^3\Sigma u^+)+e\rightarrow O(^3P)+O(^3P)+e \quad (1\text{-}2)$$

$$O_2(X^3\Sigma g^-)+e\rightarrow O_2(B^3\Sigma u^-)+e \quad (1\text{-}3)$$

$$O_2(B^3\Sigma u^-)+e\rightarrow O(^3P)+O(^1D)+e \quad (1\text{-}4)$$

Therefore, excited oxygen molecules and oxygen atoms are present in the oxygen plasma, and these constitute reaction species. When hydrogen $H_2$ is introduced thereto, plasma as shown below is generated.

$$H_2+e\rightarrow 2H \quad (2)$$

Of oxygen plasmas, oxygen plasma generated according to, for example, the expression (1-2) reacts with the hydrogen plasma generated according to the expression (2), to generate water vapor. A heated surface of the semiconductor layer is oxidized with the above water vapor, to form an oxide film on the surface of the semiconductor layer.

$$2H+O(^3P)\rightarrow H_2O \quad (3)$$

In the method of forming an oxide film, provided by the present invention, for reliably removing residual water vapor in the substrate transfer portion, preferably, the substrate-transfer-portion atmosphere is changed into an inert gas atmosphere after completion of the transfer of the substrate into the process chamber, and then, the pressure in the substrate transfer portion is reduced to remove residual water vapor in the substrate transfer portion. The step of changing the substrate-transfer-portion atmosphere into an inert gas atmosphere and then reducing the pressure in the substrate transfer portion is preferably repeated several times.

In view of process simplification, preferably, the temperature of the process-chamber atmosphere in the step (B) is set approximately at the same level as that in the step (A). The temperature of the process-chamber atmosphere in the step (C) may be set approximately at the same level as that in the step (A), or may be set at a level higher than that in the step (A). The temperature of the process-chamber atmosphere in the step (C) is between 600° C. and 1200° C., preferably between 700° C. and 1000° C., more preferably 750° C. and 900° C. although it shall not be limited to such temperatures. When the temperature of the process-chamber atmosphere in the step (C) is to be set at a higher level than that in the step (A), it is required to increase the temperature of the process-chamber atmosphere after completion of the step (B). The atmosphere in the above temperature-increasing step may be an inert gas atmosphere or a pressure-reduced atmosphere, or it may be an oxidizing atmosphere containing water vapor. The water vapor atmosphere in the process chamber in the step (C) may contain an oxygen gas or an inert gas. The inert gas includes nitrogen gas, argon gas and helium gas.

As already described, it is required to prevent the surface roughening (concavo-convex surface) of a silicon semiconductor substrate. In the present invention, the process chamber in the step (B) has a water vapor atmosphere when the substrate is transferred into the process chamber. Therefore, the formation of a so-called dry oxide film on the semiconductor layer can be reliably prevented, and an oxide film having excellent properties can be formed.

When the temperature of the process-chamber atmosphere in the step (C) is set approximately at the same level as that in the step (A), and when an oxide film is formed on the semiconductor layer on the surface of the substrate during the transfer of the substrate into the process chamber, the thus-formed oxide film works as a protective oxide film to prevent the surface roughening of the semiconductor layer when the temperature of the semiconductor layer is increased. When the temperature of the process-chamber atmosphere in the step (C) is to be set at a level higher than that in the step (A), it is required to increase the temperature of the process-chamber atmosphere after completion of the step (B). An oxide film is pre-formed on the semiconductor layer on the surface of the substrate during the transfer of the substrate into the process chamber in the step (B), or an oxide film is pre-formed at any time from the initiation of the step (B) to the initiation of an increase in temperature. In this case, the thus-formed oxide film works as a protective oxide film to prevent the surface roughening of the semiconductor layer when the temperature is increased. The oxide film thus-formed on the semiconductor layer on the surface of the substrate during the transfer of the substrate into the process chamber in the step (B), or the oxide film thus-formed at any time from the initiation of the step (B) to the initiation of an increase in temperature will be referred to as "initial oxide film" for the convenience.

Most silicon semiconductor substrates used for the production of semiconductor devices at present have a surface orientation of (100), and whatever method may be employed to flatten the surface of a silicon semiconductor substrate, the surface of a (100) silicon always comes to have a surface height difference called a "step". The "step" is generally high by a monomer layer of silicon atoms, and in some cases, there is formed a "step" which is high by two or three layers of silicon atoms. When a (100) silicon semiconductor substrate is used as a semiconductor layer, the thickness of the initial oxide film is preferably at least 1 nm, although the thickness shall not be limited thereto.

The gas containing an inert gas or water vapor in the atmosphere in the temperature-increasing step may contain a halogen element. In this case, the initial oxide film can be further improved in properties. That is, when the semiconductor layer is composed mainly of Si, a silicon dangling bond (Si.) and SiOH, i.e., defects that can occur in the initial oxide film, react with the halogen element in the temperature-increasing step, and the silicon dangling bond is terminated or a dehydration takes place. As a result, these defects that are reliability-deteriorating factors are excluded. The exclusion of these defects has an effect on the initial oxide film. The halogen element can be selected from chlorine, bromine and fluorine, and of these, chlorine is preferred. The form of the halogen element contained in the gas containing an inert gas or water vapor includes, for example, hydrogen chloride (HCl), $CCl_4$, $C_2HCl_3$, $Cl_2$, HBr and $NF_3$. The content of the halogen element in the gas containing an inert gas or water vapor as molecules or compounds is 0.001 to 10% by volume, preferably 0.005 to 10% by volume, more preferably 0.02 to 10% by volume. When hydrogen chloride gas is used, the content of the hydrogen chloride gas in the gas containing an inert gas or water vapor is preferably 0.02 to 10% by volume. The atmosphere in the temperature-increasing step may be an atmosphere containing water vapor diluted with an inert gas.

In the method of the present invention, the water vapor atmosphere in the step (C) may contain a halogen element. In this case, there can be obtained an oxide film excellent in time zero dielectric breakdown (TZDB) characteristic and time dependent dielectric breakdown (TDDB) characteristic. The halogen element can be selected from chlorine, bromine and fluorine, and of these, chlorine is preferred. The form of the halogen element contained in a gas containing water vapor includes, for example, hydrogen chloride (HCl), $CCl_4$, $C_2HCl_3$, $Cl_2$, HBr and $NF_3$. The content of the halogen element in the gas containing water vapor as molecules or compounds is 0.001 to 10% by volume, preferably 0.005 to 10% by volume, more preferably 0.02 to 10% by volume. When hydrogen chloride gas is used, the content of the hydrogen chloride gas in the gas containing water vapor is preferably 0.02 to 10% by volume.

For further improving the formed oxide film in properties, the formed oxide film may be heat-treated. In this case, the heat treatment is carried out in an inert gas atmosphere containing a halogen element. When the oxide film is heat-treated in an inert gas atmosphere containing a halogen element, there can be obtained an oxide film excellent in time zero dielectric breakdown (TZDB) characteristic and time dependent dielectric breakdown (TDDB) characteristic. The inert gas for the heat treatment includes nitrogen gas, argon gas and helium gas. The halogen element can be selected from chlorine, bromine and fluorine, and of these, chlorine is preferred. The form of the halogen element contained in the inert gas includes, for example, hydrogen chloride (HCl), $CCl_4$, $C_2HCl_3$, $Cl_2$, HBr and $NF_3$. The content of the halogen element in the inert gas as molecules or compounds is 0.001 to 10% by volume, preferably 0.005 to 10% by volume, more preferably 0.02 to 10% by volume. When hydrogen chloride gas is used, the content of the hydrogen chloride gas in the inert gas is preferably 0.02 to 10% by volume.

The formation of the oxide film and the heat treatment can be carried out in one process chamber. The temperature for the heat treatment is between 700° C. and 1200° C., preferably between 700° C. and 1000° C., more preferably between 700° C. and 950° C. When the heat treatment is carried out by a single wafer processing method, the heat treatment time is preferably 1 to 10 minutes. When it is carried out by a batch method, the heat treatment time is 5 to 60 minutes, preferably 10 to 40 minutes, more preferably 20 to 30 minutes.

When the heat treatment of the formed oxide film is carried out, preferably, the temperature of the atmosphere for the heat treatment is higher than a temperature at which the formation of the oxide film is completed. In this case, there may be employed a constitution in which, after completion of the formation of the oxide film, the process-chamber atmosphere is changed into an inert gas atmosphere and then the atmosphere is temperature-increased up to a temperature of the atmosphere for the heat treatment, or a constitution in which the atmosphere is changed into an inert gas atmosphere containing a halogen element and then the atmosphere is temperature-increased up to a temperature of the atmosphere for the heat treatment. The inert gas includes nitrogen gas, argon gas and helium gas. The halogen element can be selected from chlorine, bromine and fluorine, and of these, chlorine is preferred. The form of the halogen element contained in the inert gas includes, for example, hydrogen chloride (HCl), $CCl_4$, $C_2HCl_3$, $Cl_2$, HBr and $NF_3$. The content of the halogen element in the inert gas as molecules or compounds is 0.001 to 10% by volume, preferably 0.005 to 10% by volume, more preferably 0.02 to 10% by volume. For example, when hydrogen chloride gas is used, the content of the hydrogen chloride gas in the inert gas is preferably 0.02 to 10% by volume.

The above heat treatment may be carried out in a state where the pressure of the inert gas atmosphere containing a halogen element is lower than atmospheric pressure.

After the formation of the oxide film, or after the heat treatment, the oxide film may be subjected to nitriding treatment. In this case, preferably, the nitriding treatment is carried out in an $N_2O$ gas, NO gas or $NO_2$ gas atmosphere, and more preferably, it is carried out in an $N_2O$ gas atmosphere. Otherwise, preferably, the nitriding treatment is carried out in an atmosphere containing $NH_3$ gas, $N_2H_4$ gas or hydrazine derivative, followed by annealing in an $N_2O$ gas or $O_2$ atmosphere. The nitriding treatment is carried out at a temperature between 700° C. and 1200° C., preferably between 800° C. and 1150° C., more preferably between 900° C. and 1100° C. In this case, preferably, the semiconductor layer is heated by irradiation with infrared or by furnace annealing.

Otherwise, the heat treatment may be carried out in a nitrogen-containing gas atmosphere. The nitrogen-containing gas can be selected from $N_2$, $NH_3$, $N_2O$, $NO_2$ or NO.

Generally, before the formation of the oxide layer on a surface of a silicon semiconductor substrate, the surface of the silicon semiconductor substrate is cleaned by RCA cleaning in which it is cleaned with an $NH_4OH/H_2O_2$ aqueous solution and further cleaned with an $HCl/H_2O_2$ aqueous solution, to remove fine particles and metal impurities from its surface, and then the surface of the silicon semiconductor substrate is cleaned with a hydrofluoric acid aqueous solution and pure water. When the silicon semiconductor substrate is exposed to atmosphere thereafter, the surface of the silicon semiconductor substrate may be contaminated, or water or an organic substance may adhere to the surface of the silicon semiconductor substrate, or Si atoms in the surface of the silicon semiconductor substrate may be bonded to hydroxyl groups (OH) (for example, see the literature of "Highly-reliable Gate Oxide Formation for Giga-Scale LSIs by using Closed Wet Cleaning System and Wet Oxidation with Ultra-Dry Unloading", J. Yugami, et al., International Electron Device Meeting Technical Digest 95, pp 855–858). In such a case, when the formation of an oxide film is initiated in such a state, the formed oxide film contains water or an organic substance or contains, for example, Si—OH, which can cause the formed oxide film to degrade in properties or to have a defective portion. The defective portion refers to an oxide film portion containing a defect such as a silicon dangling bond (Si.) or an Si—H bond, or an oxide film portion containing Si—O—Si bonds which are compressed due to a stress or Si—O—Si bonds having a bond angle different from the angle of Si—O—Si bonds of a thick or bulky silicon oxide film. For avoiding the above problems, preferably, the method of the present invention includes the step of cleaning the surface of the semiconductor layer before the formation of the oxide film, and the formation of the oxide film is carried out without exposing the cleaned semiconductor layer to atmosphere (i.e., for example, using an inert gas atmosphere or a vacuum atmosphere as an atmosphere from the cleaning of the surface of the semiconductor layer to the initiation of the step of forming the oxide film). In this manner, for example, when a silicon semiconductor substrate is used as a semiconductor layer, an oxide film can be formed on a surface of a silicon semiconductor substrate most of which is terminated with hydrogen and a very small part of which is terminated with fluorine, and degradation of the formed oxide film in characteristics or occurrence of the defective portion can be prevented.

When a plasma oxidation method is used for the formation of the oxide film, hydrogen gas and oxygen gas are introduced into the process chamber of a plasma processing apparatus. In this case, it is preferred to introduce oxygen gas into the process chamber prior to the introduction of hydrogen gas for preventing hydrogen gas from flowing into the process chamber and flowing out of the apparatus to cause a detonating gas reaction. However, the introduction of oxygen gas into the process chamber may cause the formation of an oxide film on the semiconductor layer. Such an oxide film is a dry oxide film and has poor properties as compared with an oxide film formed by a wet oxidation method. For preventing the formation of the above dry oxide film, for example, hydrogen gas diluted with an inert gas such as nitrogen gas can be introduced into the process chamber and then the oxygen gas can be introduced before the initiation of the formation of the oxide film. In this case, for reliably preventing the detonating gas reaction, however, it is preferred to adjust the hydrogen gas concentration to such a concentration that hydrogen gas does not combust by a reaction with oxygen gas. Specifically, it is preferred to adjust the hydrogen concentration to a concentration lower than a detonation concentration range of hydrogen in air (lower than 18.3% by volume when the total of air and hydrogen is taken as 100% by volume), preferably, to a concentration lower than a combustion range of hydrogen in air (lower than 4.0% by volume when the total of air and hydrogen is taken as 100% by volume). Otherwise, it is preferred to adjust the hydrogen concentration to a concentration lower than a detonating range of hydrogen in oxygen (lower than 15.0% by volume when the total of oxygen and hydrogen is taken as 100% by volume), preferably, to a concentration lower than a combustion range of hydrogen in oxygen (lower than 4.5% by volume when the total of oxygen and hydrogen is taken as 100% by volume).

The semiconductor layer not only includes silicon semiconductor substrates such as a silicon single crystal wafer but also includes substrata on which the oxide layer is to be formed, such as an epitaxial silicon layer, a polysilicon layer or an amorphous silicon layer formed on a semiconductor substrate and those prepared by forming semiconductor devices in each of a silicon semiconductor substrate and these layers. The formation of an oxide film on the surface of the semiconductor layer not only refers to the formation of an oxide film on or in the semiconductor layer formed on or above the surface of the semiconductor substrate or the like, but also refers to the formation of an oxide film on or in the surface of the semiconductor substrate. The silicon single crystal wafer may be a wafer produced by any method such as a Czochralski (CZ) method, a magnetic field applied Czochralski crystal growth (MCZ) method, a DLCZ method or a floating zone (FZ) method. Further, it may be a wafer to which hydrogen annealing is applied beforehand. Further, the semiconductor layer may be composed of Si—Ge.

BRIEF DESCRIPTION OF DRAWINGS

The present invention will be explained on the basis of preferred Examples with reference to drawings hereinafter.

FIG. 1 is a conceptual view of a vertical type oxide film forming apparatus for forming an oxide film according to a pyrogenic oxidation method.

FIG. 2B, are conceptual views of the oxide film forming apparatus, etc., for explaining the method of forming an oxide film in Example 1.

FIG. 3B, are conceptual views of the oxide film forming apparatus, etc., for explaining the method of forming an oxide film in Example 1.

DESCRIPTION OF THE PREFERRED EMBODIMENTS

EXAMPLE 1

Figure 2A:
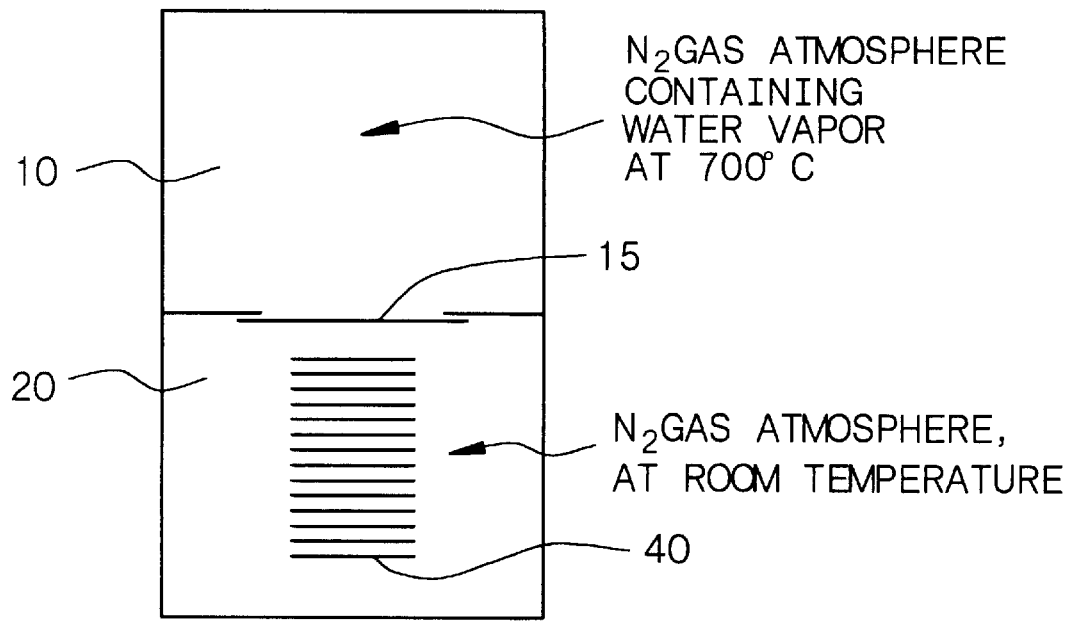
FIGS. 2A and 2B are conceptual views of the oxide film forming apparatus, etc., for explaining the method of forming an oxide film in Example 1.
Figure 2B:
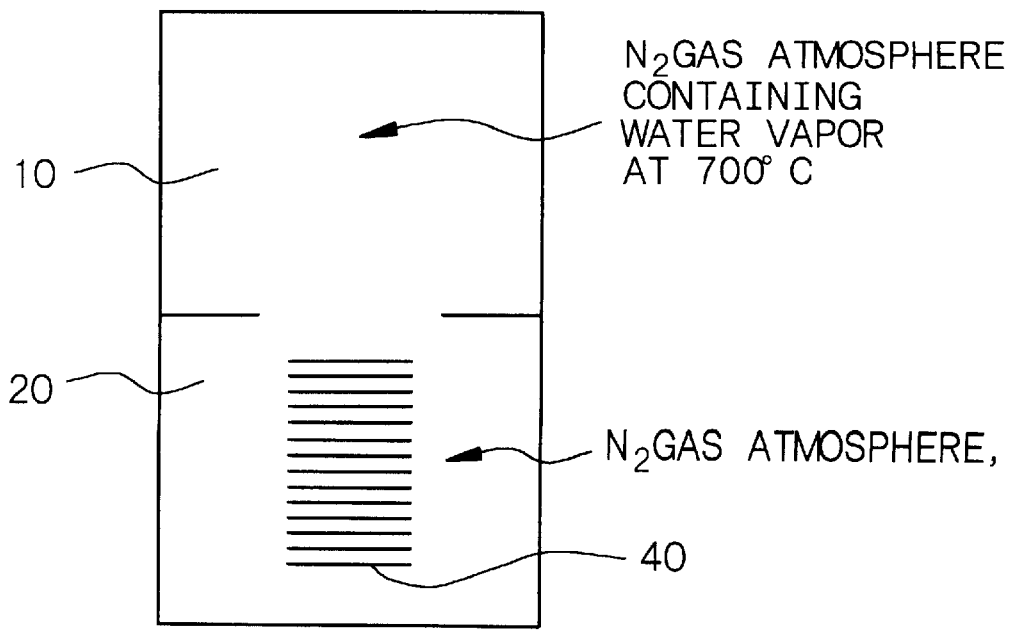

FIG. 1 shows a conceptual view of a vertical type oxide film forming apparatus for forming an oxide film according to a pyrogenic oxidation method. The vertical type oxide film forming apparatus comprises a dual-tubular-structured process chamber 10 (corresponding to an oxidation furnace) disposed in the vertical direction and made of quartz, a gas inlet port 12 for introducing a water-vapor-containing gas (wet gas) and/or other gases into the process chamber 10, a gas outlet port 13 for discharging the wet gas and/or other gases from the process chamber 10, a heater 14 for maintaining a process-chamber atmosphere at a predetermined temperature through a cylindrical heat-equalizer tube 16 made of SiC, a substrate transfer port 20, a gas inlet port 21 for introducing an inert gas such as nitrogen gas into the substrate transfer port 20, a gas outlet port 22 for discharging gas from the substrate transfer port 20, a shutter 15 which is openable and closable partitioning means provided between the process chamber 10 and the substrate transfer port 20, and an elevator mechanism 23 for transferring silicon semiconductor substrates 40 into the process chamber 10. To the elevator mechanism 23 is attached a quartz boat 24 on which the silicon semiconductor substrates 40 are to be placed. Hydrogen gas and oxygen gas fed to a combustion chamber 30 are mixed at a high temperature and combusted in the combustion chamber 30 to generate a wet gas. The wet gas is introduced into the process chamber 10 through a piping 31, a gas line 11 and the gas inlet port 12. The gas line 11 corresponds to a space between inner and outer walls of the dual-tubular-structured process chamber 10. Downstream of the gas outlet port 22 is disposed a dry pump 25, which works to change the substrate-transfer-portion atmosphere into a pressure-reduced atmosphere.

In Example 1, a silicon semiconductor substrate 40 is used as a semiconductor layer. The method of producing an oxide film, provided by the present invention, by means of the oxide film forming apparatus shown in FIG. 1 will be explained below with reference to FIGS. 2A, 2B, 3A, 3B, 4A and 4B which are conceptual views of the oxide film forming apparatus and the like.

[Step-100]

A device-isolating region having a LOCOS structure is formed in the silicon semiconductor substrate 40 which is a phosphorus-doped N type silicon wafer (produced by a Czochralski method) having a diameter of 8 inches, by a known method, and then, well ion implantation, channel stop ion implantation and threshold value adjusting ion implantation are carried out. The device-isolating region may also have a trench structure or may have a combination of a LOCOS structure and a trench structure. Then, fine particles and metal impurities on the silicon semiconductor substrate 40 are removed by RCA cleaning, and then, the surface of the silicon semiconductor substrate 40 is cleaned with a 0.1% hydrofluoric acid aqueous solution and pure water to expose the surface of the silicon semiconductor substrate 40. The silicon semiconductor substrate 40 has a surface most part of which is terminated with hydrogen and very small part of which is terminated with fluorine.

[Step-110]

Oxygen gas and hydrogen gas are introduced into the combustion chamber 30 and are mixed in the combustion chamber 30, and the hydrogen gas is combusted to generate water vapor. The water vapor (the wet gas) is introduced into the process chamber 10 through the piping 31, the gas line 11 and the gas inlet port 12, and nitrogen gas is as well introduced into the process chamber 10 through a piping 34, the gas line 11 and the gas inlet port 12, to change the process-chamber atmosphere into a water vapor atmosphere diluted with nitrogen gas. The temperature of the process-chamber atmosphere is maintained around 700° C. with the heater 14 through the heat-equalizer tube 16. In this state, the shutter 15 as the partitioning means is kept closed. The feed rate of water vapor to the process chamber 10 is set at 0.1 SLM, and the total feed rate of nitrogen gas and the water vapor is set at 10 SLM. That is, the process chamber 10 has a water vapor concentration of 1% by volume. The substrate transfer portion 20 is in a state where it is opened to atmosphere. The silicon semiconductor substrates 40 are transferred into the substrate transfer portion 20 and placed on the quartz boay 24. After completion of the transfer of the silicon semiconductor substrates 40 into the substrate transfer port 20, a door (not shown) is closed, and nitrogen gas (flow rate: 200 SLM) is introduced into the substrate transfer portion 20 through the gas inlet port 21 and discharged through the gas outlet port 22, to change the substrate-transfer-portion atmosphere into a nitrogen gas atmosphere. FIG. 2A schematically shows the above state.

[Step-120]

The oxygen gas concentration in the substrate transfer portion 20 is monitored, and when the oxygen gas concentration comes to be, for example, 100 ppm or less, it is determined that the substrate-transfer-portion atmosphere is a sufficient nitrogen gas atmosphere. Thereafter, while nitrogen gas is continuously introduced into the substrate transfer portion 20 through the gas inlet port 21, the shutter 15 is opened (see FIG. 2B), and the elevator mechanism 23 is actuated to move the quartz boat 24 upward to transfer the silicon semiconductor substrates 40 into the dual-tubular-structured process chamber 10 made of quartz (see FIG. 3A). When the elevator mechanism 23 reached the uppermost position, the process chamber 10 and the substrate transfer portion 20 do not communicate with each other any longer due to the bottom portion of the quartz boay 24. The process chamber 10 internally has a nitrogen gas atmosphere having a temperature of approximately 700° C. and a water vapor concentration of 1% by volume, so that an approximately 1 nm thick oxide film (initial oxide film) is formed on the surface of each silicon semiconductor substrate 40 immediately after the silicon semiconductor substrates 40 are introduced into the process chamber 10.

Since the introduction of nitrogen gas at a flow rate of 200 SLM into the substrate transfer portion 20 through the gas inlet port 21 is still continued, the partial pressure of water vapor in the substrate transfer portion 20 is sufficiently lower than the saturation water vapor pressure of water at a temperature of the substrate-transfer-portion atmosphere, so that no water vapor flowing into the substrate transfer portion 20 is condensed into water in the substrate transfer port 20. Nitrogen gas containing water vapor is discharged through the gas outlet port 22.

[Step-130]

Figure 3A:
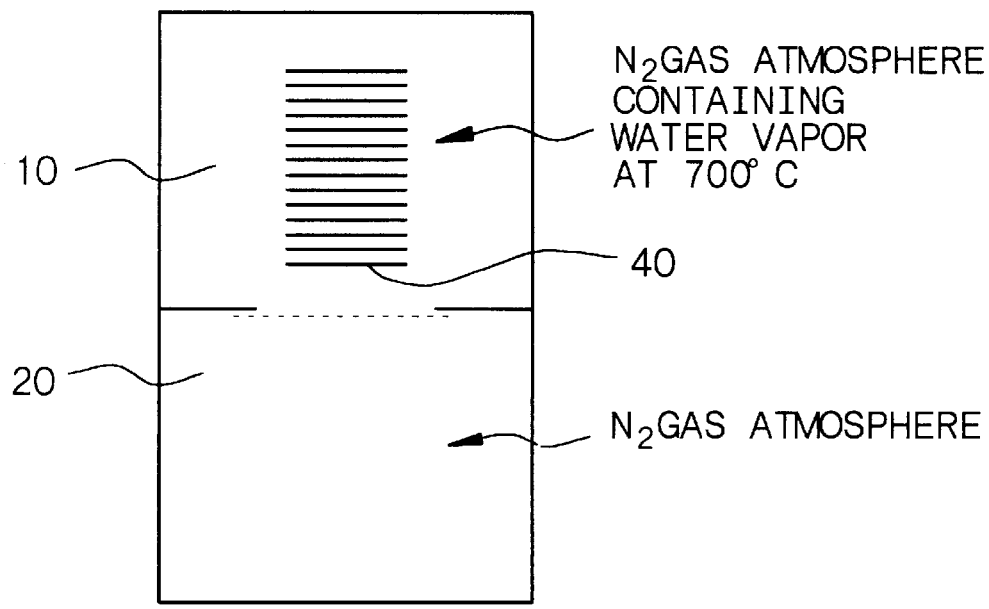
FIGS. 3A and 3B, following
Figure 3B:
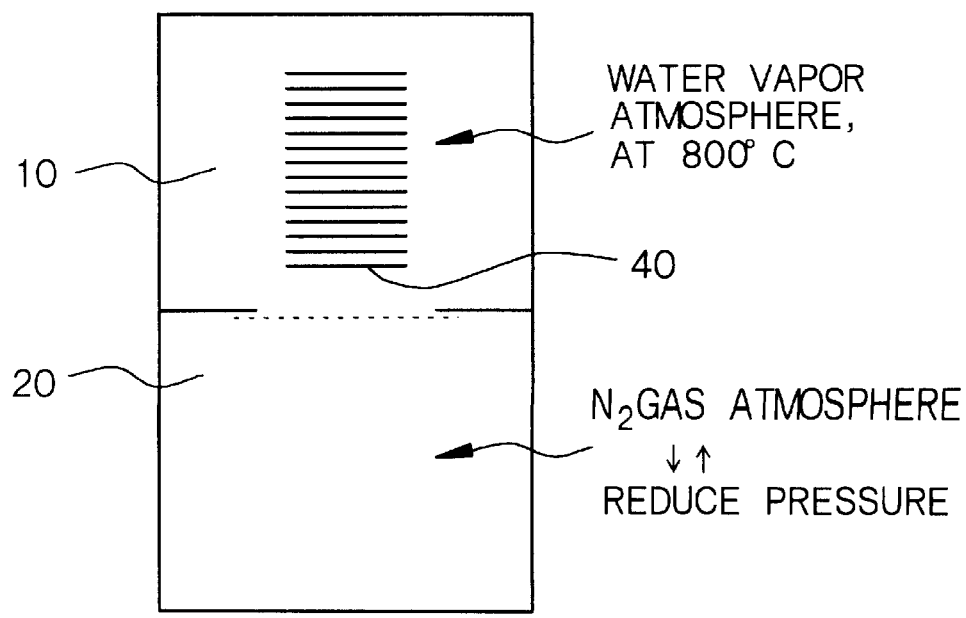
Figure 4A:
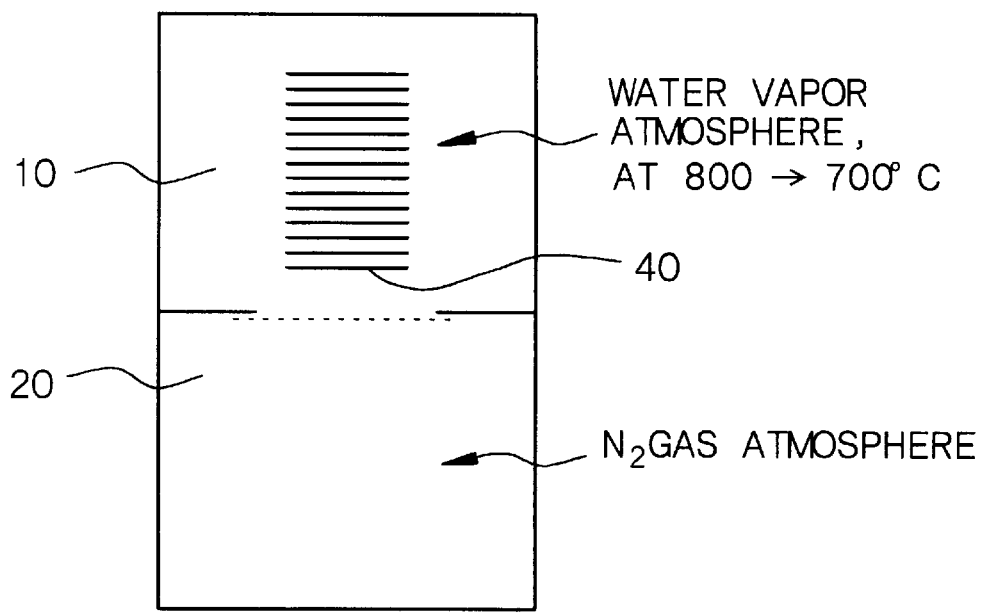
FIGS. 4A and 4B, following
Figure 4B:
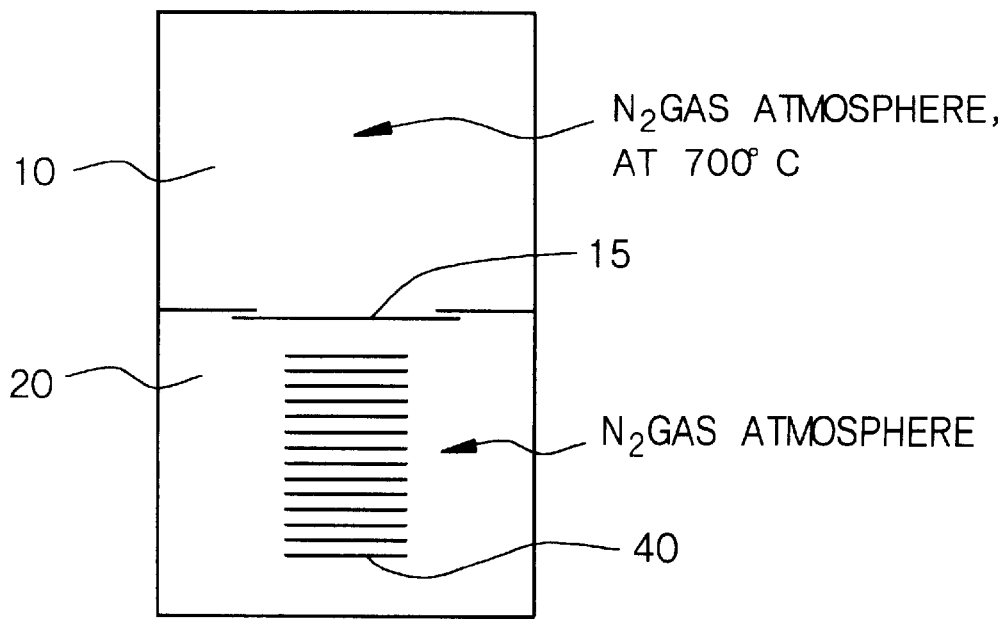

After completion of the transfer of the silicon semiconductor substrates 40 into the process chamber 10, the process-chamber atmosphere is changed into a nitrogen gas atmosphere (the feed rate of nitrogen gas into the process chamber 10 is 10 SLM), and the temperature of the process-chamber atmosphere is increased up to 800° C. After the temperature of the process-chamber atmosphere is stabilized, the introduction of nitrogen gas into the process chamber 10 is discontinued, water vapor (3 SLM) generated in the combustion chamber 30 is then introduced into the process chamber 10 through the piping 31, the gas line 11 and the gas inlet port 12, and the surface of each semiconductor layer is thermally oxidized, to form an oxide film having a predetermined thickness on the surface of each semiconductor layer. More specifically, a silicon oxide film having a total thickness of 4 nm is formed on the surface of each silicon semiconductor substrates 40. FIG. 3B shows such a state.

On the other hand, for 1 minute after completion of the transfer of the silicon semiconductor substrates 40 into the process chamber 10, nitrogen gas is introduced at a flow rate of 200 SLM into the substrate transfer portion 20 through the gas inlet port 21 and discharged through the gas outlet port 22. Then, the introduction of nitrogen gas is discontinued, and the pressure in the substrate transfer portion 20 is reduced to approximately $1.01 \times 10^4$ Pa by actuating the dry pump 25. The above step of introducing nitrogen gas into the substrate transfer portion 20 and reducing the pressure in the substrate transfer portion 20 is repeated several times, for example, five times, to reliably remove water vapor from the substrate transfer port 20.

[Step-140]

After completion of the formation of the oxide film, the temperature of the process-chamber atmosphere is decreased to 700° C., the process-chamber atmosphere is changed into an inert gas atmosphere, for example, a nitrogen gas atmosphere (see FIG. 4A), and while nitrogen gas is introduced into the substrate transfer portion 20 through the gas inlet port 21 at a flow rate of 200 SLM, the silicon semiconductor substrates 40 are transferred out of the process chamber 10. Then, the shutter 15 as the partitioning means is closed (see FIG. 4B), the introduction of nitrogen gas into the substrate transfer portion 20 is terminated, and the silicon semiconductor substrates 40 are transferred out of the substrate transfer port 20.

When it is intended to form an oxide film having far superior properties, it is preferred to carry out the following heat treatment on the oxide film. That is, after [Step-130] is finished, the introduction of water vapor into the process chamber 10 is discontinued, and while nitrogen gas is introduced into the process chamber 10 through the gas inlet port 12, the temperature of the process-chamber atmosphere is increased up to 850° C. with the heater 14. Then, nitrogen gas containing a hydrogen chloride of 0.1% by volume is introduced into the process chamber 10 through the gas inlet port 12, and each oxide film is heat-treated for 30 minutes. Then, [Step-140] is carried out.

EXAMPLE 2

Figure 5:
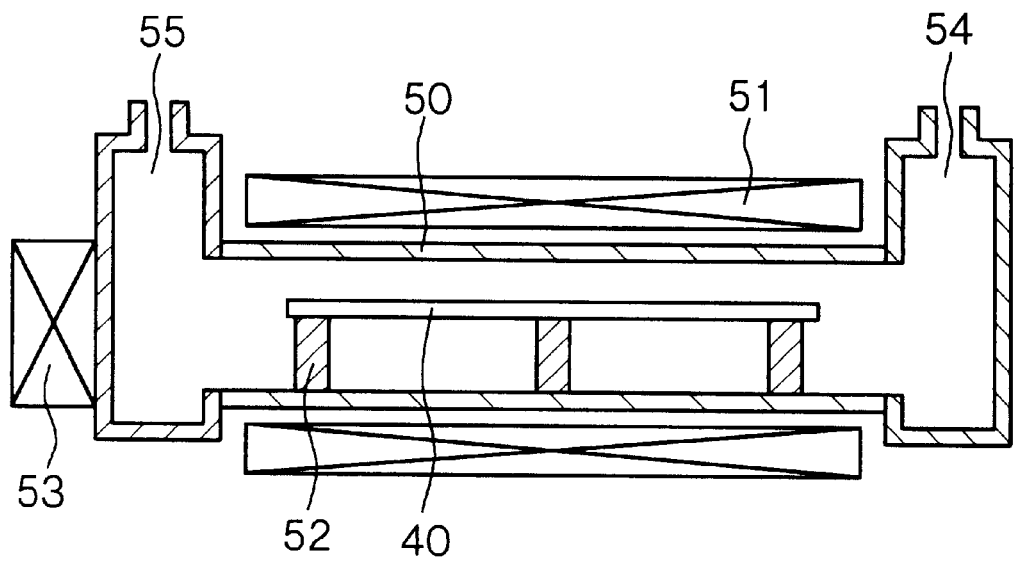
FIG. 5 is a conceptual view of a horizontal type oxide film forming apparatus for forming an oxide film according to a pyrogenic oxidation method.

FIG. 5 shows a conceptual view of a horizontal type oxide film forming apparatus for forming an oxide film according to a pyrogenic oxidation method. The oxide film forming apparatus has a process chamber 50 and a resistance heater which is heating means 51 for heating a semiconductor layer. The process chamber 50 is made of a quartz furnace core tube and is for receiving a semiconductor layer (specifically, a silicon semiconductor substrate 40) therein for forming an oxide film on the semiconductor layer. The resistance heater as heating means 51 is disposed outside the process chamber 50 and is disposed nearly in parallel with the surface of the semiconductor layer. The semiconductor layer (for example, a silicon semiconductor substrate 40) is placed on a wafer stage 52. It is transferred into and out of the process chamber 50 through a gate valve 53 which is the partitioning means disposed on one end of the process chamber 50. The oxide film forming apparatus has a gas inlet port 54 for introducing water vapor, etc., into the process chamber 50 and a gas outlet port 55 for discharging gas from the process chamber 50. A semiconductor layer (specifically, for example, the silicon semiconductor substrate 40) can be measured for a temperature with a thermocouple (not shown). Like Example 1, hydrogen gas fed to a combustion chamber is mixed with oxygen gas at a high temperature and combusted in the combustion chamber to generate water vapor. The water vapor is introduced into the process chamber 50 through a piping and the gas inlet port 54. Showing of the combustion chamber and the piping is omitted.

Figure 6:
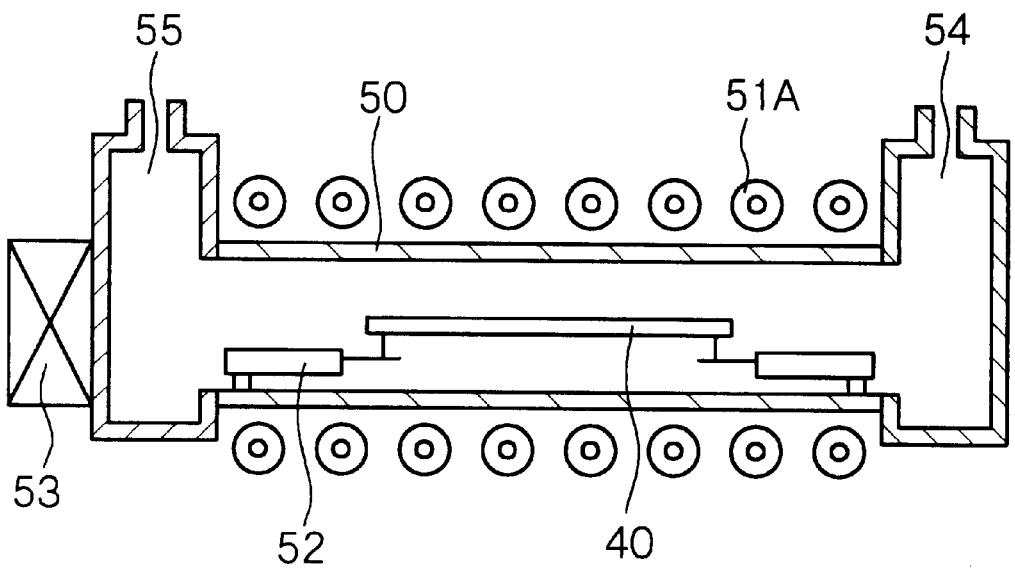
FIG. 6 is a conceptual view of a variant of the horizontal type oxide film forming apparatus for forming an oxide film according to a pyrogenic oxidation method.

Alternatively, there may be used a horizontal type oxide film forming apparatus schematically shown in FIG. 6. In the horizontal type oxide film forming apparatus shown in FIG. 6, heating means 51A is constituted of a plurality of lamps for emitting infrared rays or visible light. The silicon semiconductor substrate is measured for a temperature with a pyrometer (not shown). Since other structural elements can be basically the same as those of the oxide film forming apparatus shown in FIG. 5, detailed explanations thereof are omitted.

Figure 7:
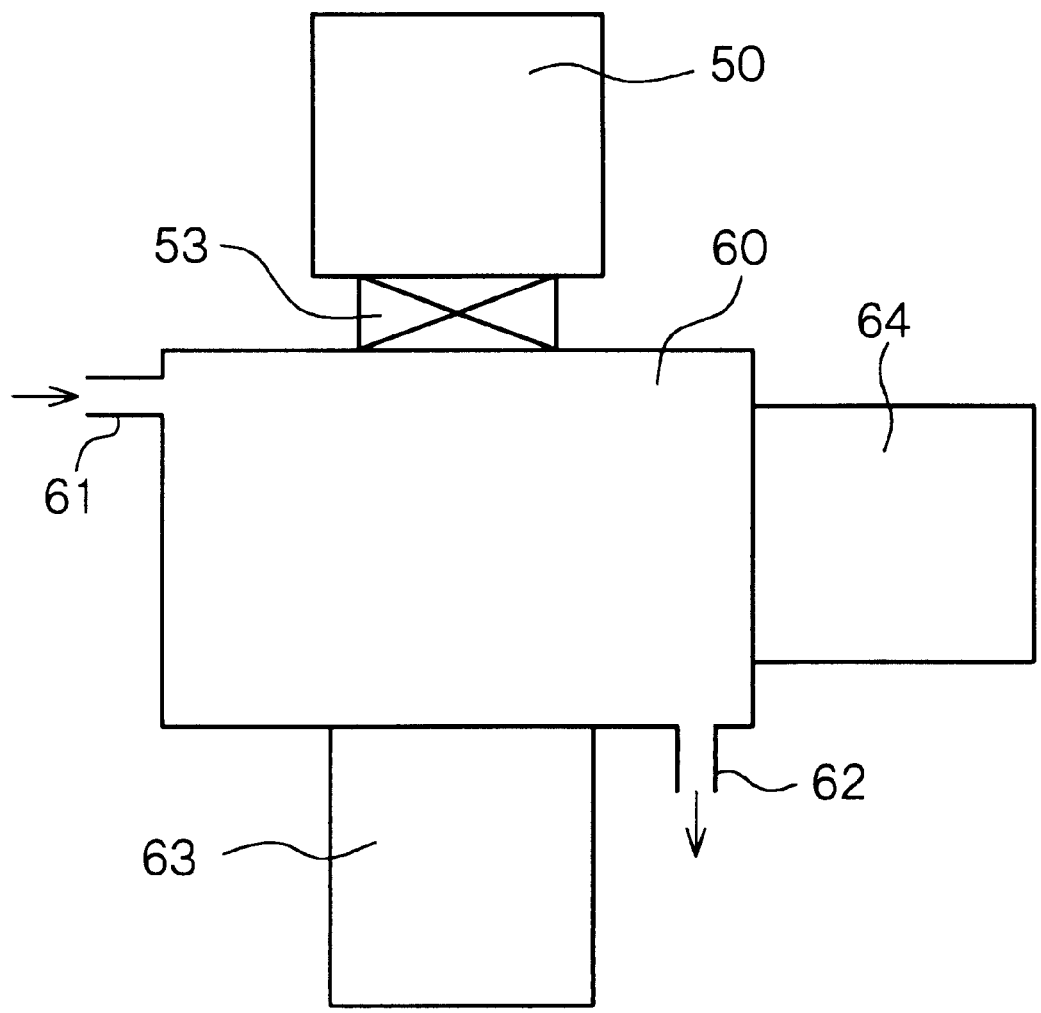
FIG. 7 is a schematic plan layout of an oxide film forming apparatus, a substrate transfer portion, a loading chamber and an unloading chamber.

The above horizontal type oxide film forming apparatus is combined with a substrate transfer portion 60, a loading chamber 63 and an unloading chamber 64. FIG. 7 shows a schematic plan layout of the oxide film forming apparatus 50, the substrate transfer portion 60, the loading chamber 63 and the unloading chamber 64. The substrate transfer portion 60 and the process chamber 50 are partitioned with the gate valve 53. Nitrogen gas is introduced into the substrate transfer portion 60 through a gas inlet port 61 and discharged through a gas outlet port 62. The silicon semiconductor substrate is transferred in and out with a carrier and a transfer robot (not shown).

The method of forming an oxide film in Example 2 will be explained hereinafter.

[Step-200]

First, the silicon semiconductor substrate 40 is prepared in the same manner as in [Step-100] in Example 1.

[Step-210]

Then, the silicon semiconductor substrate 40 is transferred into the loading chamber 63 through a door (not shown), the door is closed, and nitrogen gas is introduced into the loading chamber 63 at a flow rate of 10 SLM. In this state, the loading chamber 63 and the substrate transfer portion 60 are not in any communicated state.

[Step-220]

Then, a shutter (not shown) is opened, and the silicon semiconductor substrate is transferred into the substrate transfer portion 60 from the loading chamber 63. The substrate-transfer-portion atmosphere is a nitrogen atmosphere maintained at 100° C. in advance with a heater (not shown). That is, nitrogen gas at 10 SLM is continuously introduced into the substrate transfer portion 60 through the gas inlet port 61 and discharged through the gas outlet port 62. The temperature of the process-chamber atmosphere is maintained at a temperature between 200° C. and 300° C. with heating means, and water vapor generated in the combustion chamber and an inert gas (for example, nitrogen gas) are introduced into the process chamber 50 through the gas inlet port 54 and discharged through the gas outlet port 55. The gate valve 53 as the partitioning means is kept closed. The flow rate of the water vapor is set at 0.1 SLM, and the flow rate of the nitrogen gas is set at 15 SLM.

[Step-230]

Then, the gate valve 53 as the partitioning means is opened, and the silicon semiconductor substrate 40 is transferred into the process chamber 50 from the substrate transfer portion 60. Then, the gate valve 53 is closed, and the temperature of the process-chamber atmosphere is increased up to 400° C. at a temperature elevation rate of 50° C./second. When the temperature of the process-chamber atmosphere reaches 400° C., the process-chamber atmosphere is changed into a water vapor atmosphere. The flow rate of the water vapor is set at 1 SLM, and this state is maintained for 1 minute, whereby an oxide film can be formed on the surface of the semiconductor layer. Specifically, a silicon oxide film (initial oxide film) having a thickness of approximately 1 nm can be formed on the surface of the silicon semiconductor substrate 40. This oxide film can work as a protective oxide film. When the gate value 53 is opened, water vapor flows into the substrate transfer portion 60 from the process chamber 50. Since, however, the open time period of the gate valve 53 which is the partitioning means is very small as compared with the counter part in the vertical type oxide film forming apparatus in Example 1 (the time period of approximately 30 minutes is decreased to approximately 10 seconds), the amount of water vapor flowing into the substrate transfer portion 60 is very small, and no water vapor is condensed into water in the substrate transfer portion 60. The water vapor is discharged through the gas outlet port 62 together with the nitrogen gas.

[Step-240]

Then, the process-chamber atmosphere is changed into an inert gas atmosphere (specifically, while nitrogen gas at a flow rate of 5 SLM is introduced into the process chamber 50), the temperature of the process-chamber atmosphere is increased up to 900° C. at a temperature elevation rate of 50° C./second. After the temperature is increased, the process-chamber atmosphere is changed into a water vapor atmosphere. The flow rate of the water vapor is set at 1 SLM. And, this state is maintained, and the semiconductor layer on the surface of the substrate is oxidized to form an oxide film having a predetermined thickness on the surface of the semiconductor layer. Specifically, a silicon oxide film having a total thickness of 4.5 nm is formed on the surface of the silicon semiconductor substrate 40.

[Step-250]

After the oxide film is formed, the process-chamber atmosphere is changed into an inert gas atmosphere, and the temperature of the process-chamber atmosphere is decreased to 400° C. at a rate of 50° C./second. Then, the gate valve 53 is opened, the silicon semiconductor substrate 40 is transferred into the substrate transfer portion 60, and the gate valve 53 is closed. Then, the silicon semiconductor substrate 40 is transferred into the unloading chamber 64, and further, it is transferred out of the unloading chamber 64.

When it is intended to form an oxide film having far superior properties, it is preferred to carry out the following heat treatment on the oxide film. That is, after [Step-240] is finished, the introduction of water vapor into the process chamber 50 is discontinued, and while nitrogen gas is introduced into the process chamber 50 through the gas inlet port 54, the temperature of the process-chamber atmosphere is increased up to 850° C. with the heating means. Then, nitrogen gas containing hydrogen chloride gas of 0.1% by volume is introduced into the process chamber 50 through the gas inlet port 54, and the oxide film is heat-treated for 5 minutes. Then, [Step-250] is carried out.

The present invention has been explained with preferred Examples, while the present invention shall not be limited to these Examples. Various conditions and the structures of the oxide film forming apparatuses explained in Examples are shown as examples and can be altered as required. For example, there may be employed a constitution in which a heater is disposed in the substrate transfer portion 20 of the oxide film forming apparatus shown in FIG. 1 and the temperature of the substrate-transfer-portion atmosphere is maintained at an appropriate temperature, i.e., a temperature at which the partial pressure of the water vapor in the substrate transfer portion 20 is less than the saturation water vapor pressure of water at the temperature of the substrate-transfer-portion atmosphere. In Example 2, after completion of the transfer of the silicon semiconductor substrate 40 into the process chamber 50, nitrogen gas is introduced into the substrate transfer portion 60 through the gas inlet port 61 and discharged through the gas outlet port 62. Then, the introduction of the nitrogen gas is discontinued, and the pressure in the substrate transfer portion 60 is reduced to approximately $1.01 \times 10^4$ Pa by actuating a dry pump. The above step of introducing nitrogen gas into the substrate transfer portion 60 and reducing the pressure in the substrate transfer portion 60 may be repeated several times.

For example, in [Step-130] in Example 1 or in [Step-240] in Example 2, the temperature of the process-chamber atmosphere may be increased up to a predetermined temperature in a nitrogen gas atmosphere containing water vapor, without changing the process-chamber atmosphere into a nitrogen gas atmosphere. Further, when the temperature is increased up to a predetermined temperature, the atmosphere may contain, for example, 0.1% by volume of hydrogen chloride gas. Moreover, the atmosphere during the formation of an oxide film may contain, for example, 0.1% by volume of hydrogen chloride gas.

In Examples, the oxide film is formed on the surface of the silicon semiconductor substrate, while the oxide film may be formed on an epitaxial silicon layer formed on a substrate, or the oxide film may be formed on a polysilicon layer or an amorphous silicon layer formed on an insulating layer formed on a substrate, as well, according to the present invention. Otherwise, the oxide film may be formed on a silicon layer in an SOI structure.

Figure 8:
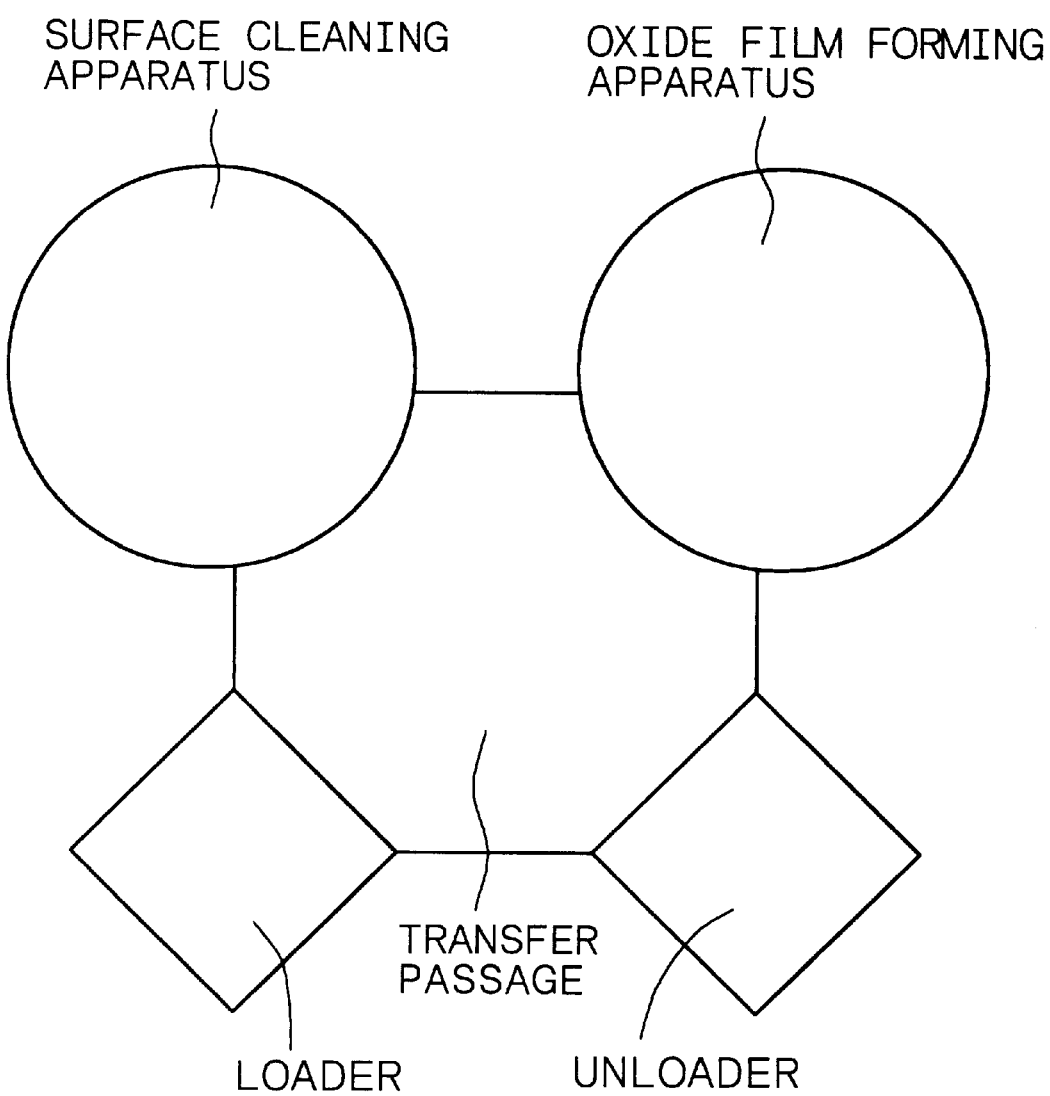
FIG. 8 is a schematic view of a cluster tool equipment.

In Examples, the semiconductor layer is surface-cleaned with a 0.1% hydrofluoric acid aqueous solution and with pure water and then transferred into the oxide film forming apparatus. Alternatively, an inert gas atmosphere (for example, nitrogen gas atmosphere) may be employed for procedures from cleaning the surface of the semiconductor layer up to transferring the semiconductor layer into the oxide film forming apparatus. Such an atmosphere can be attained by a method in which the atmosphere in an apparatus for cleaning the surface of the semiconductor layer is kept in an inert gas atmosphere and the semiconductor layer(s) (for example, silicon semiconductor substrate(s)) is encased in a transfer box filled with an inert gas and transferred into the substrate transfer portion of the oxide film forming apparatus, or a method in which there is provided a cluster tool equipment comprising a surface cleaning apparatus, the oxide film forming apparatus, a transfer passage, a loader and an unloader as schematically shown in FIG. 8, the surface cleaning apparatus and the oxide film forming apparatus are connected with the transfer passage, and an inert gas is employed as an atmosphere in each of the surface cleaning apparatus, the transfer passage and the substrate transfer portion of the oxide film forming apparatus.

Alternatively, the semiconductor layer may be surface-cleaned by a gaseous phase cleaning method using an anhydrous hydrofluoric acid gas under a condition shown in Table 1, instead of cleaning the surface of the semiconductor layer with a 0.1% hydrofluoric acid aqueous solution and with pure water. For preventing the generation of particles, methanol is added. Otherwise, the semiconductor layer may be surface-cleaned by a gaseous phase cleaning method using a hydrogen chloride gas under a condition shown in Table 2. Before the surface-cleaning of the semiconductor layer is initiated or after the surface cleaning is completed, the atmosphere in the surface cleaning apparatus, the transfer passage and so on may be an inert gas atmosphere, or it may be a vacuum atmosphere having a vacuum degree, for example, of approximately $1.3 \times 10^{-1}$ Pa ($10^{-3}$ Torr). When the atmosphere in the transfer passage, etc., is changed into a vacuum atmosphere, there may be employed a constitution in which the substrate-transfer-portion atmosphere in the oxide film forming apparatus is changed into a vacuum atmosphere having a vacuum degree of approximately $1.3 \times 10^{-1}$ Pa ($10^{-3}$ Torr), and, after the transfer of the semiconductor layer(s) into the substrate transfer portion is completed, the substrate-transfer-portion atmosphere is changed into an inert gas (for example, nitrogen gas) atmosphere.

TABLE 1

| Anhydrous hydrofluoric acid gas | 300 SCCM |
|---|---|
| Methanol vapor | 80 SCCM |
| Nitrogen gas | 1000 SCCM |
| Pressure | 0.3 Pa |
| Temperature | 60° C. |

TABLE 2

| Hydrogen chloride gas/nitrogen gas | 1% by volume |
|---|---|
| Temperature | 800° C. |

The surface of the semiconductor layer can be kept free from contaminants, etc., before the formation of the oxide film by employing the above methods, and as a result, there can be effectively prevented the inclusion of water and an organic substance, or the inclusion, for example, of Si—OH, in a formed oxide film, so that the degradation of properties of a formed oxide film or the occurrence of a defective portion can be effectively prevented.

Figure 9:
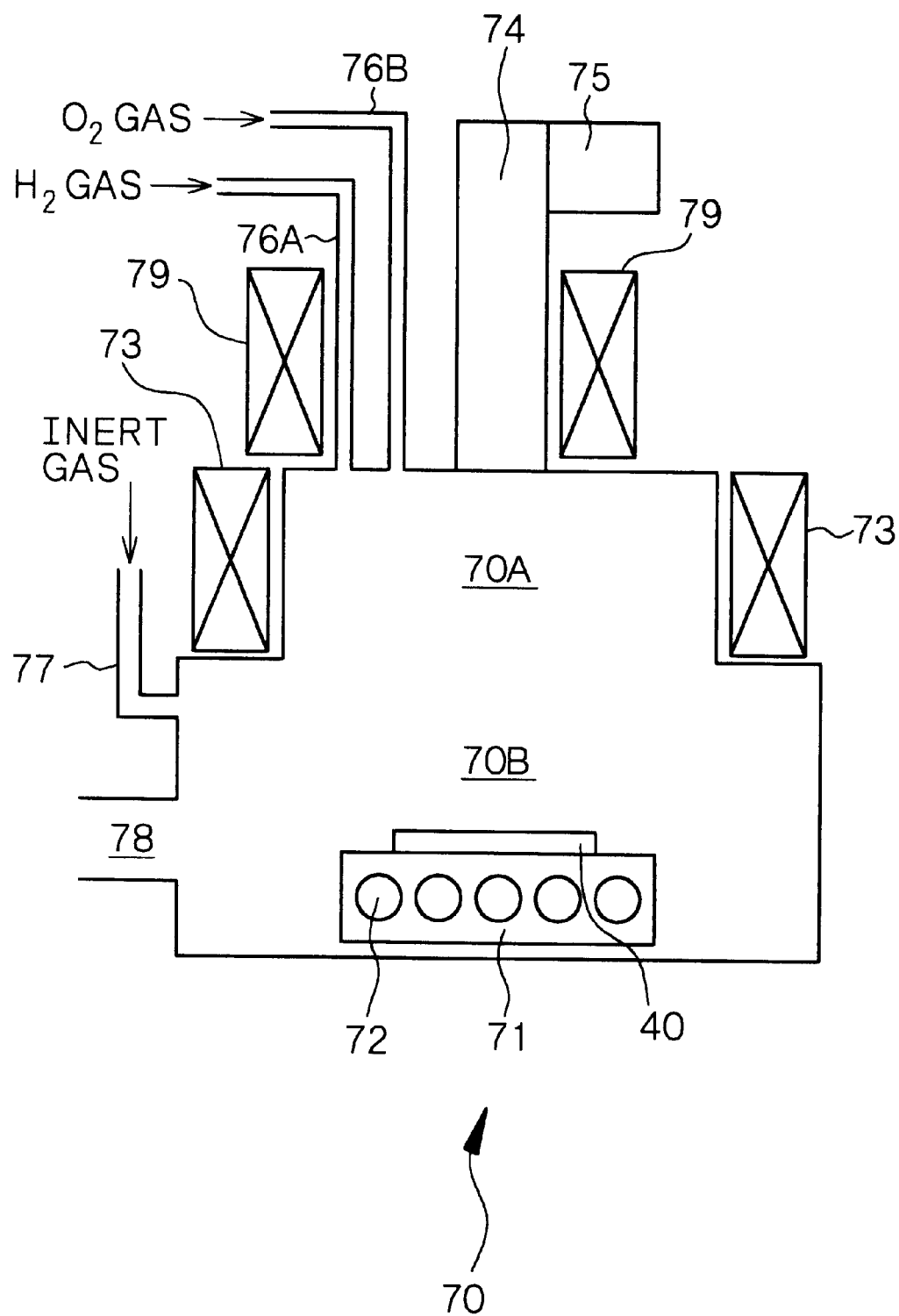
FIG. 9 is a conceptual view of a plasma processing apparatus feasible for practicing the method of the present invention.
Figure 10:
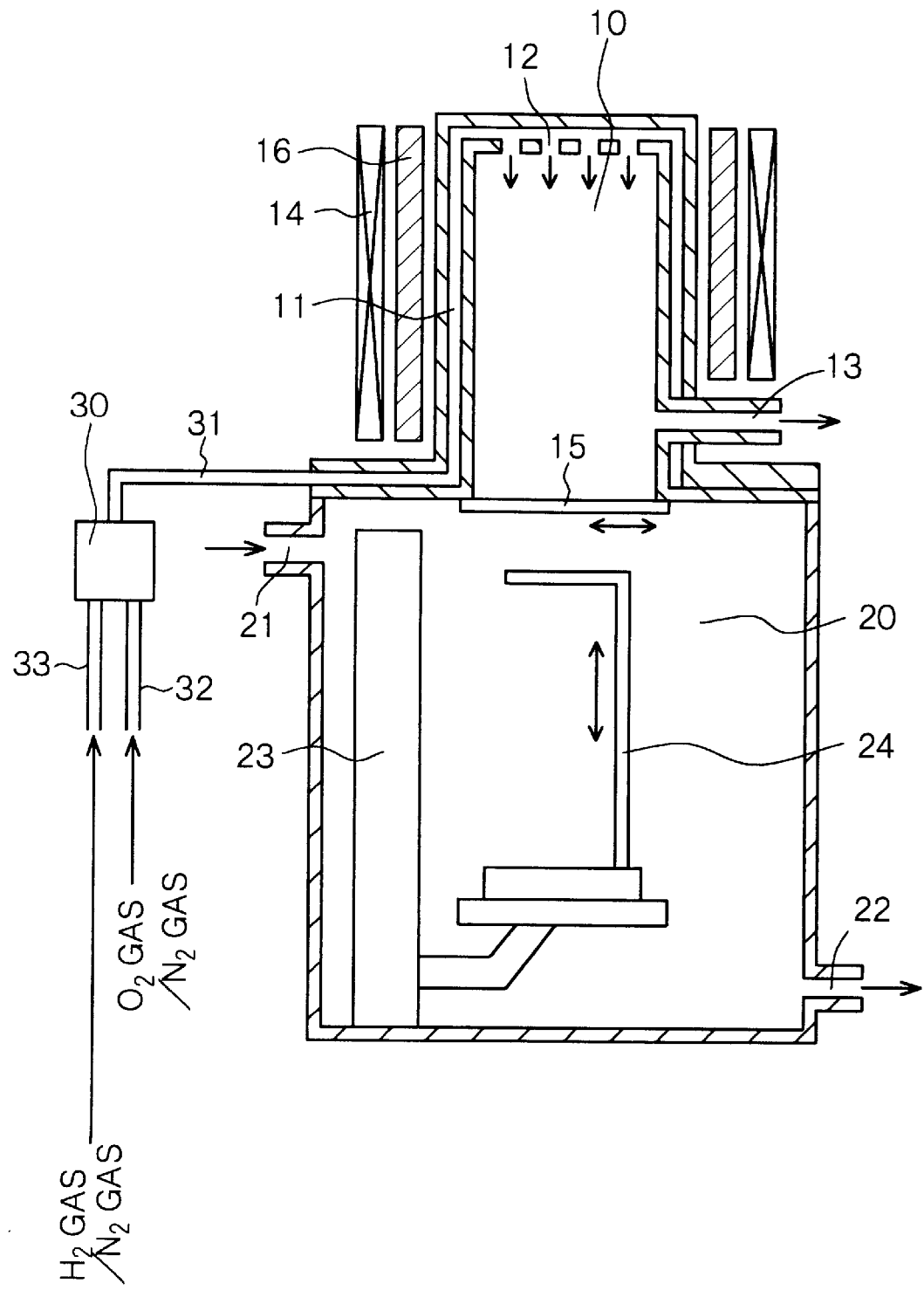
FIG. 10 is a conceptual view of a conventional vertical type oxide film forming apparatus for forming an oxide film according to a pyrogenic oxidation method.

FIG. 9 shows a single wafer type plasma processing apparatus for generating water vapor by reacting oxygen plasma and hydrogen plasma. The plasma processing apparatus has a process chamber 70, a stage 71 on which a semiconductor layer (for example, a silicon semiconductor substrate 40) is to be placed, a magnet 73 disposed outside the process chamber 70, a microwave waveguide 74 attached to a top portion of the process chamber 70, and gas inlet ports 76A and 76B disposed on the top portion of the process chamber 70. The process chamber 70 is constituted of a plasma generating region 70A and a plasma processing region 70B, and the stage 71 is disposed in the plasma processing region 70B. The stage 71 internally has lamps which are heating means 72 for heating the silicon semiconductor substrate 40. The microwave waveguide 74 is provided with a magnetron 75, the magnetron 75 is for generating 1 GHz to 100 GHz microwaves (for example, 2.45 GHz microwave), and the microwave is introduced into the plasma generating region 70A of the process chamber 70 through the microwave waveguide 74. Further, hydrogen gas and oxygen gas are introduced into the process chamber 70 through gas inlet ports 76A and 76B, respectively. Further, an inert gas (for example, nitrogen gas) is introduced into the process chamber 70 through a gas inlet port 77 disposed on a side of the process chamber 70. Those various gases introduced into the process chamber 70 are discharged through a gas outlet port 78. The process chamber 70 externally has a heater 79 for controlling the internal temperature in the process chamber 70 such that water vapor in the process chamber 70 is not condensed into water.

Oxygen gas and hydrogen gas in the plasma generating region 70A are irradiated with 1 GHz to 100 GHz microwaves (for example, 2.45 GHz microwave) to generate water vapor. Part of the water vapor is in a plasma state. The semiconductor layer is exposed to such water vapor and hydrogen gas in the plasma processing region 70B, to form an oxide film on the surface of the semiconductor layer.

In the present invention, the process chamber has a water vapor atmosphere when a substrate is transferred into the process chamber of the oxide film forming apparatus, so that the formation of a so-called dry oxide film on a semiconductor layer can be reliably prevented and that an oxide film having excellent properties can be formed. In the oxide film forming apparatus, further, thermal oxidation with water vapor can be carried out at the stage of initiation of oxidation without involving the condensation of water vapor into water. Further, since no condensation into water takes place, there can be prevented a phenomenon that condensation of water vapor into water on the surface of the semiconductor layer causes the formation of a non-uniform oxide film. Moreover, the oxide film forming apparatus is not corroded, nor is there caused a problem that an oxide film is deteriorated in properties due to metallic contaminants. Further, since a substrate can be inserted in the process-chamber atmosphere fully filled with water vapor, a wet oxide film can be formed without involving the formation of a dry oxide film which is conventionally said to be inevitable in the pyrogenic method, even if a pyrogenic method is employed as a method of generating water vapor. These effects enable the production of a very thin oxide film having excellent electric reliability.

What is claimed is:

1. A method of forming an oxide film by means of an oxide film forming apparatus having;
   (a) a substrate transfer portion,
   (b) a process chamber which communicates with the substrate transfer portion and is for thermally oxidizing a semiconductor layer on a surface of a substrate in a water vapor atmosphere, to form an oxide film, and
   (c) openable and closable partitioning means provided between the substrate transfer portion and the process chamber,
   the method comprising the steps of;
   (A) generating a water vapor atmosphere in the process chamber in a state where the partitioning means is closed, and transferring the substrate into the substrate transfer portion, (B) opening the partitioning means after the transfer of the substrate into the substrate transfer portion is completed, and transferring the substrate into the process chamber having the water vapor atmosphere, (C) thermally oxidizing the semiconductor layer on the surface of the substrate in the process chamber having the water vapor atmosphere, to form an oxide film having a predetermined thickness on the surface of the semiconductor layer, and (D) changing the atmosphere in the process chamber into an inert gas atmosphere, then transferring the substrate out of the process chamber, closing the partitioning means and transferring the substrate out of the substrate transfer portion.

2. The method of forming an oxide film according to claim 1, wherein in the step (B), an oxide film is formed on the surface of the semiconductor layer during the transfer of the substrate into the process chamber.

3. The method of forming an oxide film according to claim 1, wherein in the step (B), the substrate transfer portion is maintained in a state where water vapor which has flowed into the substrate transfer portion from the process chamber during the transfer of the substrate into the process chamber is not condensed into water in the substrate transfer portion.

4. The method of forming an oxide film according to claim 3, wherein an inert gas is introduced into the substrate transfer portion such that the partial pressure of the water vapor in the substrate transfer portion is lower than the saturation water vapor pressure of water at a temperature of the atmosphere in the substrate transfer portion, for generating a state where the water vapor which has flowed into the substrate transfer portion from the process chamber is not condensed into water in the substrate transfer portion.

5. The method of forming an oxide film according to claim 1, wherein in the step (B), an inert gas is introduced into the process chamber such that the partial pressure of the water vapor in the substrate transfer portion is lower than the saturation water vapor pressure of water at a temperature of the atmosphere in the substrate transfer portion, for attaining a state where water vapor which has flowed into the substrate transfer portion from the process chamber during the transfer of the substrate into the process chamber is not condensed into water in the substrate transfer portion.

6. The method of forming an oxide film according to claim 1, wherein a method of generating water vapor to be introduced into the process chamber is at least one method selected from;

(1) a method in which a hydrogen gas and an oxygen gas are reacted at a high temperature, (2) a method in which pure water is heated, (3) a method in which heated pure water is bubbled with an oxygen gas or an inert gas, (4) a method in which a hydrogen gas and an oxygen gas are reacted in the presence of a catalyst, and (5) a method in which oxygen plasma and hydrogen plasma are reacted.

7. The method of forming an oxide film according to claim 1, wherein the atmosphere in the substrate transfer portion is changed into an inert gas atmosphere after completion of the transfer of the substrate into the process chamber, and then, the pressure in the substrate transfer portion is reduced to remove residual water vapor in the substrate transfer portion.

* * * * *